(12) United States Patent
Angioni et al.

(10) Patent No.: US 11,730,008 B2
(45) Date of Patent: Aug. 15, 2023

(54) LIGHT EMITTING LAYER INCLUDING QUANTUM DOTS WITH IMPROVED CHARGE CARRIER MOBILITY

(71) Applicant: SHARP KABUSHIKI KAISHA, Sakai (JP)

(72) Inventors: Enrico Angioni, Oxford (GB); Iain Hamilton, Oxford (GB); Edward Andrew Boardman, Abingdon (GB); Andrea Zampetti, Abingdon (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 173 days.

(21) Appl. No.: 17/176,509

(22) Filed: Feb. 16, 2021

(65) Prior Publication Data

US 2022/0263039 A1 Aug. 18, 2022

(51) Int. Cl.
*H10K 50/115* (2023.01)
*H10K 50/16* (2023.01)
*H10K 50/15* (2023.01)
*H10K 50/818* (2023.01)
*H10K 50/828* (2023.01)

(52) U.S. Cl.
CPC .......... *H10K 50/115* (2023.02); *H10K 50/15* (2023.02); *H10K 50/16* (2023.02); *H10K 50/818* (2023.02); *H10K 50/828* (2023.02)

(58) Field of Classification Search
CPC combination set(s) only.
See application file for complete search history.

(56) References Cited

U.S. PATENT DOCUMENTS

| 9,073,752 B2 | 7/2015 | Kang et al. |
| 10,424,755 B2 | 9/2019 | Seo et al. |
| 10,826,011 B1 * | 11/2020 | Angioni ................ H10K 50/15 |
| 2021/0126216 A1 * | 4/2021 | Umeda .................. H05B 33/14 |

FOREIGN PATENT DOCUMENTS

| CN | 106098956 A | 11/2016 |
| CN | 108899430 A | 11/2018 |
| KR | 20070097255 A | 10/2007 |
| WO | WO-2019186847 A1 * | 10/2019 ......... H01L 51/5004 |

* cited by examiner

*Primary Examiner* — Daniel Whalen
(74) *Attorney, Agent, or Firm* — ScienBiziP, P.C.

(57) ABSTRACT

A light emitting device comprises a first electrode, a second electrode, and an emissive layer (EML) between the first electrode and the second electrode and electrically connected to the first electrode and the second electrode. The EML comprises a charge transport matrix of a first polarity, a plurality of quantum dots in the charge transport matrix, and a plurality of charge transport nanoparticles of a second polarity in the charge transport matrix.

20 Claims, 6 Drawing Sheets

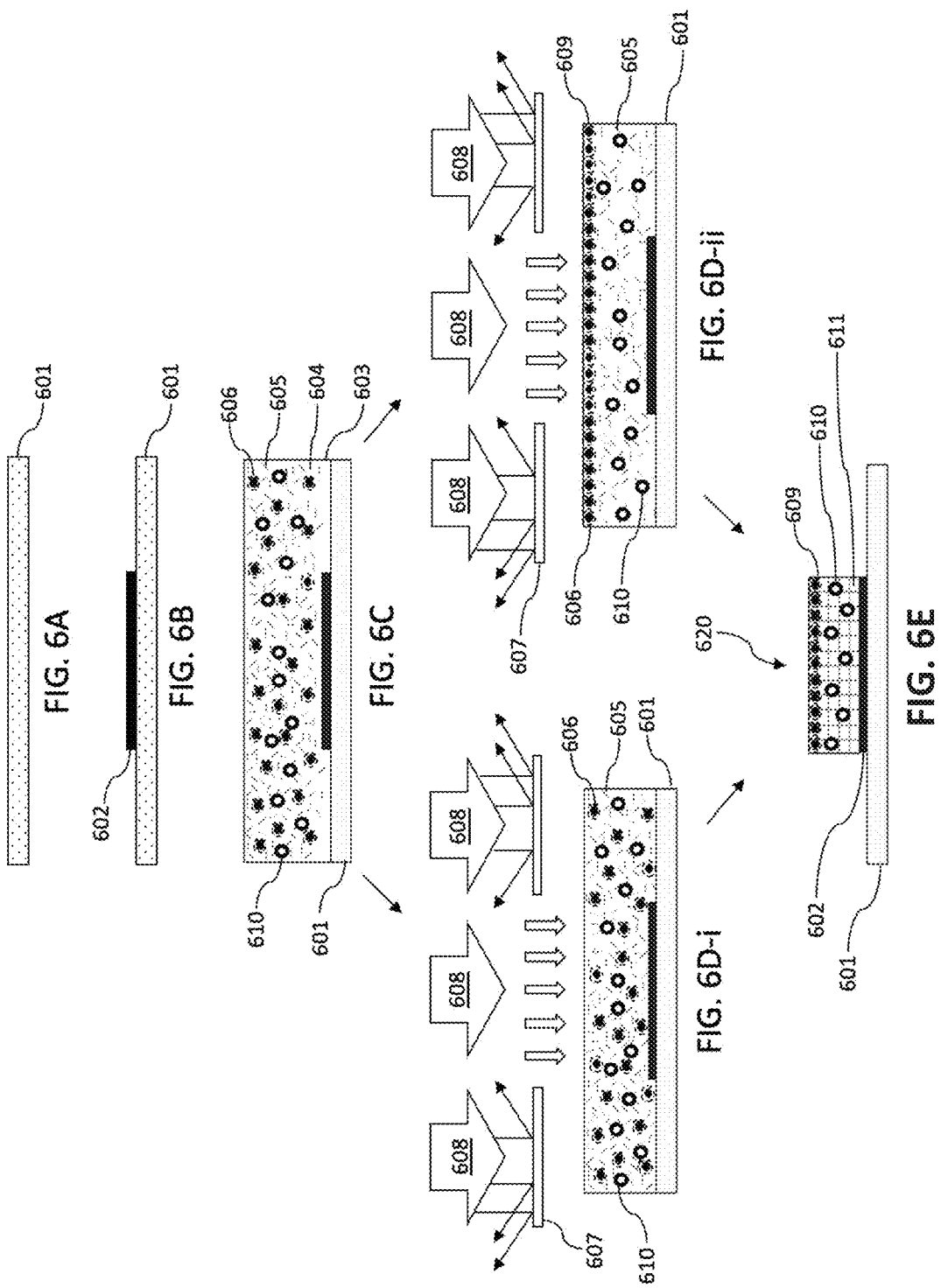

LIGHT EMITTING LAYER INCLUDING QUANTUM DOTS WITH IMPROVED CHARGE CARRIER MOBILITY

FIELD

The present disclosure is related to a layered structure applicable to a light emissive device, and specifically, a Quantum Dot Light Emitting Diode (QLED) including a light emitting layer with an increased charge carrier mobility and improved efficiency.

BACKGROUND

The addition of material into the emissive layer (EML) of a semiconductor light-emitting device is well known within the art. Organic light-emitting diodes (OLEDs) may use an EML having a material that includes two types of molecules, specifically molecules acting as a charge transport host and molecules acting as an emissive guest. Quantum dot light-emitting diodes, also known as QLEDs, QD-LEDs, or electroluminescent quantum dots (ELQDs), include an additional organic component around the quantum dot emitters to improve the mobility of one charge carrier (holes or electrons) and are also known in the art.

U.S. Pat. No. 10,424,755 B2 to Semiconductor Energy Laboratory Co Ltd., published on Sep. 24, 2019, describes an OLED in which emissive guest molecules are contained within an electron transport host material and to which a hole transport assist material is added.

Korean Patent Publication No. KR20070097255 A to Korea Research Institute of Chemical Technology, published on Oct. 4, 2007, describes a QLED in which the active layer includes quantum dots within a p-type organic semiconductor layer.

Chinese Patent Publication No. CN106098956 A to TCL Group Co Ltd., published on Nov. 9, 2016, describes a QLED in which the EML may include two separate layers in physical contact with one another. The first layer is a mix of quantum dots and a hole transport material, the second layer is a mix of quantum dots and an electron transport material.

Chinese Patent Publication No. CN108899430 A to BOE Technology Group Co Ltd., published on Nov. 27, 2018, describes a QLED in which a material is added to the EML to increase both the mobility and the number of electrons in the EML.

U.S. Pat. No. 9,073,752 B2 to LG Display Co Ltd., published on Jul. 7, 2015, describes a QLED in which the EML contains quantum dots, p-type semiconductor nanoparticles and n-type semiconductor nanoparticles.

CITATION LIST

U.S. Pat. No. 10,424,755 B2 to Semiconductor Energy Laboratory Co Ltd., published on Sep. 24, 2019.
Korean Patent Publication No. KR20070097255 A to Korea Research Institute of Chemical Technology, published on Oct. 4, 2007.
Chinese Patent Publication No. CN106098956 A to TCL Group Co Ltd., published on Nov. 9, 2016.
Chinese Patent Publication No. CN108899430 A to BOE Technology Group Co Ltd., published on Nov. 27, 2018.
U.S. Pat. No. 9,073,752 B2 to LG Display Co Ltd., published on Jul. 7, 2015.

SUMMARY

The present disclosure is related to a QLED, including a light emitting layer with an increased charge carrier mobility and improved efficiency.

In a first aspect of the present disclosure, a light emitting device comprises a first electrode, a second electrode, and an emissive layer (EML) between the first electrode and the second electrode and electrically connected to the first electrode and the second electrode. The EML comprises: a charge transport matrix having a first polarity; a plurality of quantum dots in the charge transport matrix; and a plurality of charge transport nanoparticles having a second polarity in the charge transport matrix.

In an implementation of the first aspect, the plurality of charge transport nanoparticles conducts charge carriers opposite to charge carriers conducted by the charge transport matrix.

In another implementation of the first aspect, the light emitting device further comprises an electron transport layer (ETL) between the EML and the first electrode, wherein the first electrode is a cathode.

In yet another implementation of the first aspect, the ETL comprises metal oxide nanoparticles.

In yet another implementation of the first aspect, the plurality of charge transport nanoparticles in the EML and the metal oxide nanoparticles in the ETL are identical in composition.

In yet another implementation of the first aspect, the light emitting device further comprises a hole transport layer (HTL) between the EML and the first electrode, wherein the first electrode is an anode.

In yet another implementation of the first aspect, the HTL comprises hole transport organic molecules.

In yet another implementation of the first aspect, the hole transport organic molecules are arranged in a matrix comprising long chain polymers.

In yet another implementation of the first aspect, the charge transport matrix in the EML includes organic molecules identical in composition to the hole transport organic molecules in the HTL.

In yet another implementation of the first aspect, the first electrode is a cathode disposed between a substrate and the EML, and the second electrode is an anode.

In yet another implementation of the first aspect, the first electrode is an anode disposed between a substrate and the EML, and the second electrode is a cathode.

In yet another implementation of the first aspect, the first electrode is disposed between a substrate and the EML, the first electrode reflects light, and the second electrode transmits light.

In yet another implementation of the first aspect, the first electrode is disposed between a substrate and the EML, the first electrode transmits light, and the second electrode reflects light.

In yet another implementation of the first aspect, a display device comprises a substrate, and a plurality of the light emitting devices on the substrate, wherein each of the light emitting devices emits one of: a red light with a wavelength between 600 nm and 700 nm, a green light with a wavelength between 500 nm and 600 nm, and a blue light with a wavelength between 400 nm and 500 nm.

In yet another implementation of the first aspect, an average separation distance between two adjacent ones of the plurality of charge transport nanoparticles is less than an average diameter of the plurality of charge transport nanoparticles.

In yet another implementation of the first aspect, an average diameter of the plurality of charge transport nanoparticles is greater than an average diameter of the plurality of quantum dots.

In a second aspect of the present disclosure, an emissive layer (EML) of a light emitting device comprises a charge transport matrix of a first polarity, a plurality of quantum dots in the charge transport matrix, and a plurality of charge transport nanoparticles of a second polarity in the charge transport matrix.

In an implementation of the second aspect, the plurality of charge transport nanoparticles conducts charge carriers opposite to charge carriers conducted by the charge transport matrix.

In another implementation of the second aspect, an average separation distance between two adjacent charge transport nanoparticles of the plurality of charge transport nanoparticles is less than an average diameter of the plurality of charge transport nanoparticles.

In yet another implementation of the second aspect, an average diameter of the plurality of charge transport nanoparticles is greater than an average diameter of the plurality of quantum dots.

BRIEF DESCRIPTION OF DRAWINGS

Aspects of the present disclosure are best understood from the following detailed disclosure when read with the accompanying figures. Various features are not drawn to scale. Dimensions of various features may be arbitrarily increased or reduced for clarity of discussion.

FIG. 6A, FIG. 6B, FIG. 6C, FIG. 6D-i, FIG. 6D-ii, and FIG. 6E illustrate fabrication processes of a light-emitting device according to example implementations of the present disclosure.

DESCRIPTION

Figure 1:
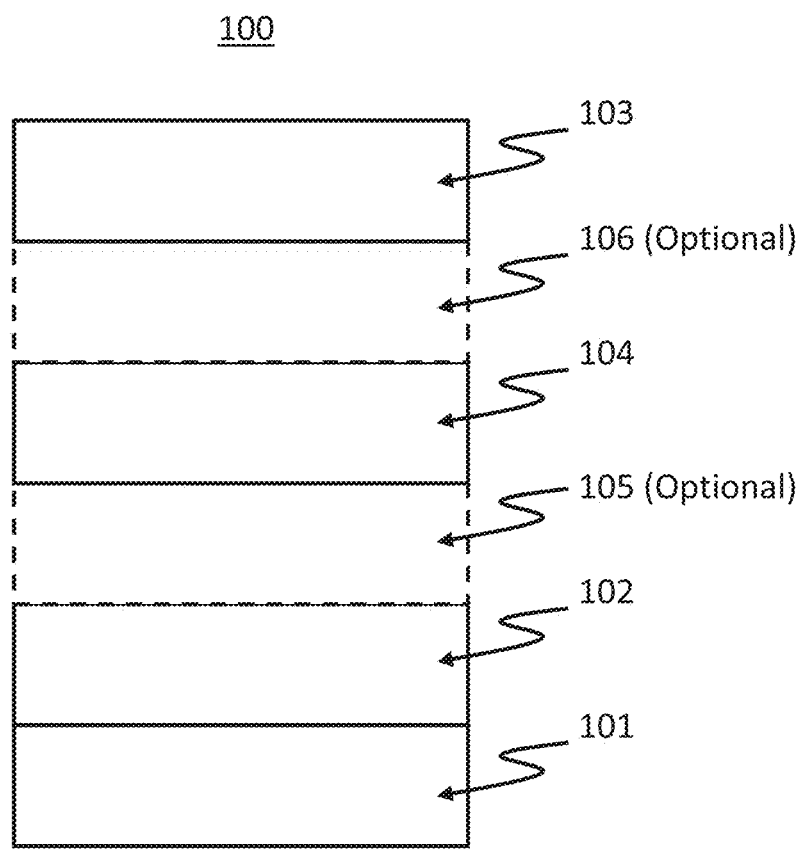
FIG. 1 illustrates a cross sectional view of a QLED according to related art.

The following disclosure contains specific information related to example implementations of the present disclosure. The drawings and their accompanying detailed disclosure are directed to merely example implementations.

However, the present disclosure is not limited to merely these example implementations. Other variations and implementations of the present disclosure will occur to those skilled in the art.

Unless noted otherwise, like or corresponding elements among the figures may be indicated by like or corresponding reference numerals. Moreover, the drawings and illustrations in the present disclosure are generally not to scale and are not intended to correspond to actual relative dimensions.

For the purpose of consistency and ease of understanding, like features may be identified (although, in some examples, not shown) by the same numerals in the example figures. However, the features in different implementations may be different in other respects, and thus shall not be narrowly confined to what is shown in the figures.

The phrases "in one implementation," or "in some implementations," may each refer to one or more of the same or different implementations. The term "coupled" is defined as connected, whether directly or indirectly through intervening components, and is not necessarily limited to physical connections. The term "comprising" means "including, but not necessarily limited to" and specifically indicates open-ended inclusion or membership in the so-described combination, group, series and the equivalent. The expression "at least one of A, B and C" or "at least one of the following: A, B and C" means "only A, or only B, or only C, or any combination of A, B and C."

Additionally, for the purposes of explanation and non-limitation, specific details, such as functional entities, techniques, protocols, standard, and the like are set forth for providing an understanding of the described technology. In other examples, detailed disclosure of well-known methods, technologies, systems, architectures, and the like are omitted so as not to obscure the present disclosure with unnecessary details.

The present disclosure is related to designs of an emissive layer (EML), also known as an active layer, of a QLED. FIG. 1 illustrates a cross sectional view of a QLED 100 according to related art.

A first electrode 102 is arranged on a substrate 101, with a second electrode 103 arranged opposite to the first electrode 102 on a same side of the substrate 101. An EML 104, which contains quantum dots, is arranged between the first electrode 102 and the second electrode 103 and is in electrical contact with each of the first electrode 102 and the second electrode 103. Quantum dots are defined as particles with a physical radius smaller than the exciton Bohr radius.

The QLED 100 may further include a first charge transport layer 105 between the first electrode 102 and the EML 104, and a second charge transport layer 106 between the second electrode 103 and the EML 104. Each of the first charge transport layer 105 and the second charge transport layer 106 may be one or more charge injection layers, charge transport layers, and charge blocking layers.

In a QLED said to have a "standard" structure, the first electrode 102 is closer to the substrate 101 and is an anode, and the first charge transport layer 105 between the first electrode 102 and the EML 104 can be a hole injection layer, a hole transport layer, or an electron blocking layer. Similarly, the second electrode 103 is further from the substrate 101 and is a cathode, and the second charge transport layer 106 between the second electrode 103 and the EML 104 can be an electron injection layer, an electron transport layer, or a hole blocking layer. The positions of the anode and the cathode, along with all the injection, transport and blocking layers, may be reversed, in which case the QLED 100 is said to have an "inverted" structure.

When an electrical bias is applied to the QLED 100, holes are conducted from the anode to the EML 104 and electrons are conducted from the cathode to the EML. Holes and electrons recombine at the quantum dots in the EML 104, generating light.

Some of the light is emitted out of the QLED 100 and is perceivable by an external viewer. Light generated in the EML 104 may be emitted through the substrate 101, in which case the QLED 100 is called "bottom-emitting," or emitted through a surface opposite to the substrate, in which case the QLED 100 is called "top-emitting."

In a QLED 100 in which the EML 104 contains only quantum dots, both the hole mobility and the electron mobility of the EML 104 are typically low. A thick EML 104 will result in increased operating voltage due to the build-up of electrons and holes at interfaces between the EML 104 and the adjacent layers. However, reducing a thickness of the EML 104 may increase the probability of leakage paths, through which electrons or holes may pass through the EML 104 without recombining and emitting photons, and resulting in the light emitting device having low efficiency.

In the present disclosure, charge transport nanoparticles are added to the EML 104 to improve the hole mobility or electron mobility of the EML 104. The charge transport nanoparticles may be n-type, in which case the electron mobility is improved, or p-type, in which case the hole mobility is improved.

The quantum dots and charge transport nanoparticles may be contained within a charge transport organic matrix. The dominant charge carrier of the organic matrix is the opposite of the dominant charge carrier of the nanoparticles.

For example, if the nanoparticles are n-type (an electron transporter) then the organic matrix is a p-type (a hole transporter), and if the nanoparticles are p-type (a hole transporter) then the organic matrix is an n-type (an electron transporter). Such designs of the QLED 100 increase the mobility of both holes and electrons in the EML 104, thereby preventing the build-up of charge at interfaces at the EML 104 and improving longevity of the light emitting device.

When the charge transport nanoparticles are p-type, the charge transport nanoparticles have a conduction band energy which is higher than both the conduction band energy of the quantum dots and the lowest unoccupied molecular orbital (LUMO) energy of the n-type material of the organic matrix, thereby preventing the charge transport nanoparticles from accepting electrons and increasing the probability that electrons will be transferred to the quantum dots. Likewise, when the charge transport nanoparticles are n-type, the charge transport nanoparticles have a valence band energy which is lower than both the valence band energy of the quantum dots and the highest occupied molecular orbital (HOMO) energy of the p-type material of the organic matrix, thereby preventing the charge transport nanoparticles from accepting holes and increasing the probability that holes will be transferred to the quantum dots.

According to the present disclosure, both the p-type and the n-type charge transport nanoparticles have energy band gaps larger than an energy band gap of the quantum dots and a quenching phenomenon may be reduced. Quenching occurs when excitons on the quantum dots are transferred to the dominant charge carrier of the organic matrix and undergo non-radiative recombination. By such manipulation of materials according to the present disclosure, if excitons are formed in the organic matrix, the probability that the excitons being transferred to the quantum dots and radiatively combined may be increased, instead of the excitons undergoing non-radiative recombination in the organic matrix.

To prevent the organic matrix from acting as a blocking layer to charge carriers having an opposite polarity to the organic matrix, separations between the charge transport nanoparticles in the organic matrix should be small. The separations between adjacent charge transport nanoparticles may be less than a diameter of the charge transport nanoparticles. Charge carriers are transferred from one of the charge transport nanoparticles to an adjacent one of the charge transport nanoparticles mainly through tunneling.

Preferably, in designing QLEDs of a p-type organic matrix and n-type charge transport nanoparticles, materials are selected such that the LUMO energy of the p-type organic matrix is close to the conduction band energy of the n-type charge transport nanoparticles. Conversely, in designing QLEDs of an n-type organic matrix and p-type charge transport nanoparticles, materials are selected such that the HOMO energy of the n-type organic matrix is close to the valence band energy of the p-type charge transport nanoparticles. Such selections and combinations of materials can decrease energy barriers for charge carriers to tunneling, i.e., hopping from one charge transport nanoparticle to another charge transport nanoparticle through the EML 104.

The hole mobility and the electron mobility of the EML 104 may be adjusted by changing the spacing between the charge transport nanoparticles and by changing volume ratios of the organic matrix, the charge transport nanoparticles, and the quantum dots. Such manipulation may be achieved by depositing the EML 104 by spin coating from a solution and varying the concentrations of organic molecules, charge transport nanoparticles and quantum dots. The resulting QLEDs may have a balanced hole current vs. electron current, which is important for achieving an LED with high efficiency and a long operating lifetime.

The organic matrix in the EML 104 of the present disclosure results in continuous, smooth interfaces, compared to the discrete particles of the quantum dots and the charge transport nanoparticles in the related art. The organic matrix of the present disclosure may result in interfaces between the EML 104 and the adjacent layers becoming planar. A smooth surface may improve charge transport properties across the interfaces, thereby reducing operating voltage and improving device efficiency.

The material of the organic matrix of the present disclosure may also be one of two types (p-type or n-type) of charge transport materials in the EML 104. A display device according to the present disclosure is one in which red, green and blue sub-pixels are each a QLED 100.

The organic matrix may be selectively created around the quantum dots and the charge transport nanoparticles, such as by polymerization of organic monomers under illumination by ultraviolet light. A subsequent washing step may then be performed using a solvent to which the organic matrix is insoluble but the organic monomers, the quantum dots and the charge transport nanoparticles are soluble. In this way, three EMLs in which the quantum dots emit red light, green light and blue light, respectively, can be selectively fabricated based on predetermined positions to make red, green and blue sub-pixels.

Mixtures of the quantum dots and the organic molecules deposited by spin coating may exhibit phase separation, in which the quantum dots preferentially move to either the top or the bottom of the resulting layer. A majority of the quantum dots in the EML 104 may be found at the upper surface of the EML 104.

If no charge transport nanoparticles are included, then the organic matrix in a standard (non-inverted) structure must be made from a hole transport material or holes will be blocked by the organic matrix from reaching the quantum dots, which are distributed closer to the cathode than the anode. Similarly, in an inverted structure without charge transport nanoparticles included, the organic matrix must be made from an electron transport material.

It may, therefore, be understood that the inclusion of charge transport nanoparticles in the EML 104 according to the present disclosure increases choices of the organic material to form the organic matrix. In a standard structure, p-type charge transport nanoparticles may be dispersed approximately uniformly within the organic matrix and an electron transport material may be selected as the organic matrix. In an inverted structure, n-type nanoparticles may be dispersed approximately uniformly within the organic matrix and a hole transport material may be selected as the organic matrix. This is particularly desirable where a particular organic material is required to be used as the matrix such that the particular organic material is polymerizable in forming a patterned EML 104 as part of a display device, as previously described.

If the majority of the quantum dots are found at the bottom of the EML 104, then the majority charge carrier of the organic matrix and charge transport nanoparticle is reversed for both the standard and the inverted structures as previously described.

The tendency of the quantum dots or the charge transport nanoparticles to phase separate from the organic matrix may be manipulated. The manipulation may be the choice of ligands on surfaces of the quantum dots and the charge transport nanoparticles, the choice of an average size of the charge transport nanoparticles, the choice of the material of the layer onto which the EML 104 is deposited, functionalizing the layer onto which the EML 104 is deposited or adjusting the atmospheric conditions (such as gas composition or pressure) during deposition of the EML 104.

Figure 2:
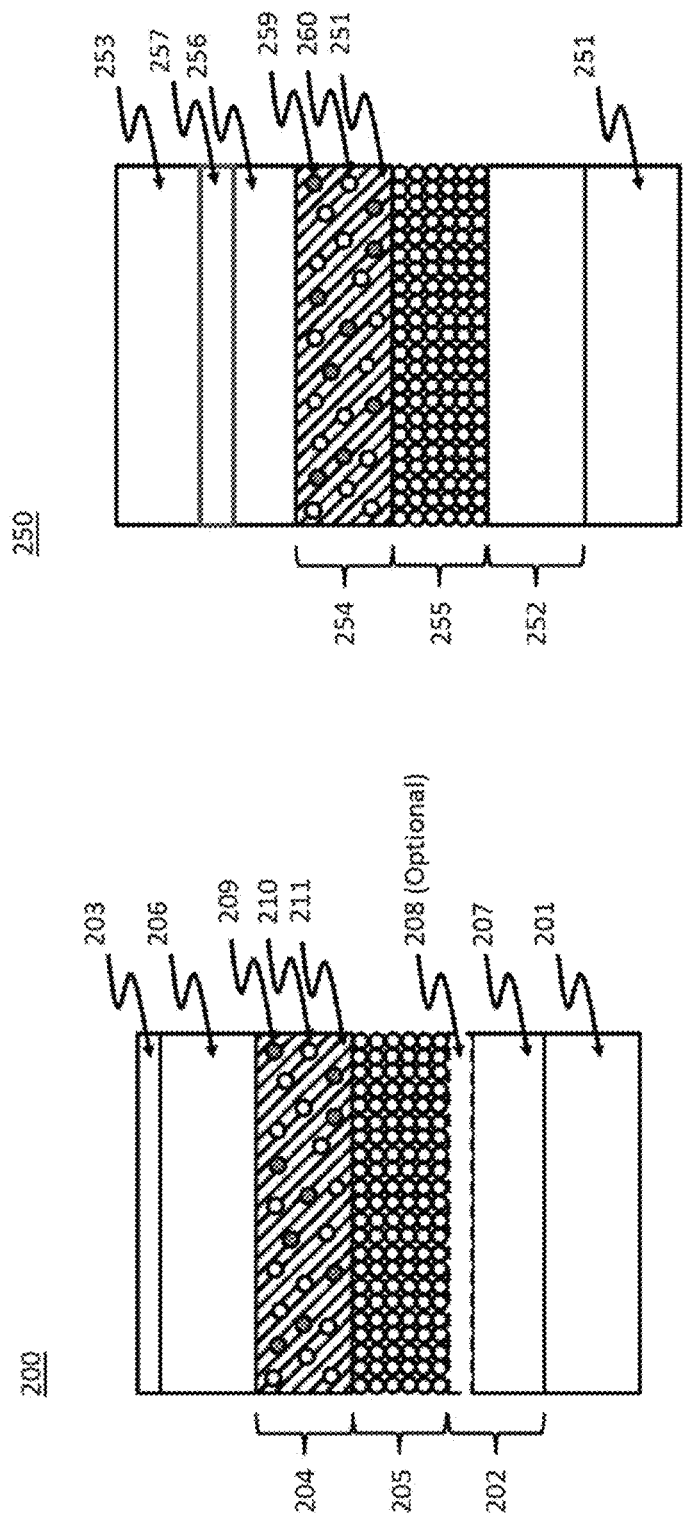
FIG. 2A illustrates a cross-sectional view of a top-emitting QLED according to an example implementation of the present disclosure, in which an EML includes quantum dots and charge transport nanoparticles in a charge transport organic matrix.
FIG. 2B illustrates a cross-sectional view of a bottom emitting QLED according to an example implementation of the present disclosure, in which the EML includes quantum dots and charge transport nanoparticles in a charge transport organic matrix.

FIG. 2A illustrates a cross-sectional view of a top-emitting QLED 200 according to an example implementation of the present disclosure, in which an EML 204 includes quantum dots 209 and charge transport nanoparticles 210 in a charge transport organic matrix 211. A reflector 207 which has high reflectivity (>80%) at the wavelength of the light emitted by the QLED 200 is deposited on a substrate 201. The reflector 207 may be made of metal and the substrate 201 may be made of glass.

An optional conductive layer 208 which has high internal transmission (>80%) at the wavelength of light emitted by the QLED 200 may be deposited on the reflector 207. The reflector 207 and the conductive layer 208 cooperatively form a first electrode 202 which is a cathode.

The first electrode 202 (the cathode) may be connected to a means of applying an electrical bias, such as a thin-film transistor (TFT) backplane. A first charge transport layer 205 which is electron transport, is deposited on the first electrode 202.

The first charge transport layer 205 (electron transport) may include organic molecules or inorganic nanoparticles. The first charge transport layer 205 includes metal oxide nanoparticles.

An EML 204 is deposited on the first charge transport layer 205 and is a mixture of quantum dots 209, charge transport nanoparticles 210 and a charge transport organic matrix 211. Additional components to initiate the polymerization of the charge transport organic matrix 211 may be added to the previously described mixture of the EML 204 before or after deposition of the EML 204.

The charge transport nanoparticles 210 are compositionally identical to the nanoparticles in the first charge transport layer 205. The charge transport organic matrix 211 conducts charges having a polarity opposite to the charge transport nanoparticles 210. The charge transport nanoparticles 210 are hole transporting.

Similar to the EML 204, the quantum dots 209 and charge transport nanoparticles 210 are uniformly distributed within the charge transport organic matrix 211 that is made of a hole transport material. However, similar to molecular particles there may be some randomness in the distribution of the quantum dots 209 and the charge transport nanoparticles 210 within the charge transport organic matrix 211. The quantum dots 209 are configured to have an electroluminescent wavelength equal to a desired emission wavelength of the QLED 200.

A post-deposition treatment may be applied to promote polymerization of the charge transport organic material to form the charge transport organic matrix 211.

A second charge transport layer 206 is deposited on the EML 204. The second charge transport layer 206 is hole transporting. The second charge transport layer 206 may contain organic molecules or inorganic nanoparticles. The second charge transport layer 206 includes organic molecules which are compositionally identical to organic molecules of the charge transport organic matrix 211 in the EML 204.

A second electrode 203, an anode in this implementation, includes a hole injection layer (not shown) deposited on the second charge transport layer 206 and one or more thin metal layers. The hole injection layer (not shown) may contain organic molecules, metallo-organic complexes or inorganic nanoparticles. The thin metal layers are deposited on the hole injection layer (not shown) and form the second electrode 203 (the anode) of the QLED 200.

The second electrode 203 has a transmission >10% at the wavelength of light emitted by the QLED 200. Light emitted by the quantum dots 209 in the EML 204 may be emitted through the second electrode 203, either directly or after reflecting off the reflector 207 in the first electrode 202, and the OLED 200 is a top-emitting device. The first electrode 202, which is the cathode of the device, is closer to the substrate 201 than the second electrode 203, the anode, and the QLED 200 has an inverted structure.

It should be understood by one skilled in the art that the charge transport nanoparticles 210 in the EML 204 could be hole transport nanoparticles and the charge transport organic material could be an electron transport material without substantially affecting the functionality of the QLED 200. While the previous description is for an inverted, top-emitting QLED 200 the present disclosure could equally be applied to both standard QLEDs and bottom-emitting QLEDs. For a standard QLED 200, positions of the cathode and the anodes are reversed, and the layers between the EML 204 and the electrodes (202, 203) are swapped.

An anode may be deposited on a substrate 201, onto which a hole injection layer is deposited. A hole transport organic layer is deposited onto the hole injection layer.

An EML 204, containing a mixture of quantum dots, charge transport nanoparticles, charge transport organic molecules and optionally a polymerization initiator is deposited on the hole transport layer. A metal oxide nanoparticle electron transport layer is deposited on the EML 204 and a cathode is subsequently deposited on the electron transport layer. Optionally, an electron injection layer (not shown)

may be deposited between the electron transport layer and the cathode prior to deposition of the cathode.

FIG. 2B illustrates a cross-sectional view of a bottom emitting QLED 250 according to an example implementation of the present disclosure in which the EML 254 includes quantum dots 259 and charge transport nanoparticles in a charge transport organic matrix 251. A first electrode 252 is a cathode with high transparency (>80%) at the wavelength of light emitted by the QLED 250 is deposited on a substrate 201.

A first charge transport layer 255 is deposited on the first electrode 252 (the cathode). The first charge transport layer 255 is electron transporting and includes metal oxide nanoparticles.

An EML 254 containing a mixture of quantum dots 259, charge transport nanoparticles 260, and a charge transport organic matrix 251 including charge transport organic molecules and optionally a polymerization initiator is deposited on the first charge transport layer 255 (electron transport).

A second charge transport layer 256 is deposited on the EML 254. The second charge transport layer 256 is an organic hole transport layer.

A hole injection layer 257 is deposited on the second charge transport layer 256 (hole transport), followed by a second electrode 253 which is an anode having high reflectivity (>80%) to the wavelength of the light emitted by the QLED 250. Light is emitted by the quantum dots 259 in the EML 254 through the substrate 201, either directly or after reflecting off the second electrode 253.

The EML 204, 254 according to the present disclosure as illustrated in FIGS. 2A and 2B improves charge transport from the interfaces of the EML 204, 254 to the quantum dots 259, with electrons transported via the charge nanoparticles and holes transported via the charge transport organic matrix 251, or vice versa. Such an implementation reduces the operating voltage of the QLED 200, 250 compared to an EML having a similar concentration of quantum dots implemented according to the related art. Furthermore, the present disclosure prevents the build-up of charge carriers at the interface of the EML 204, 254 which may improve the lifetime of the device. Implementations of suitable materials and deposition methods according to the present disclosure for each of the layers previously described are provided later in this disclosure.

Figure 3:
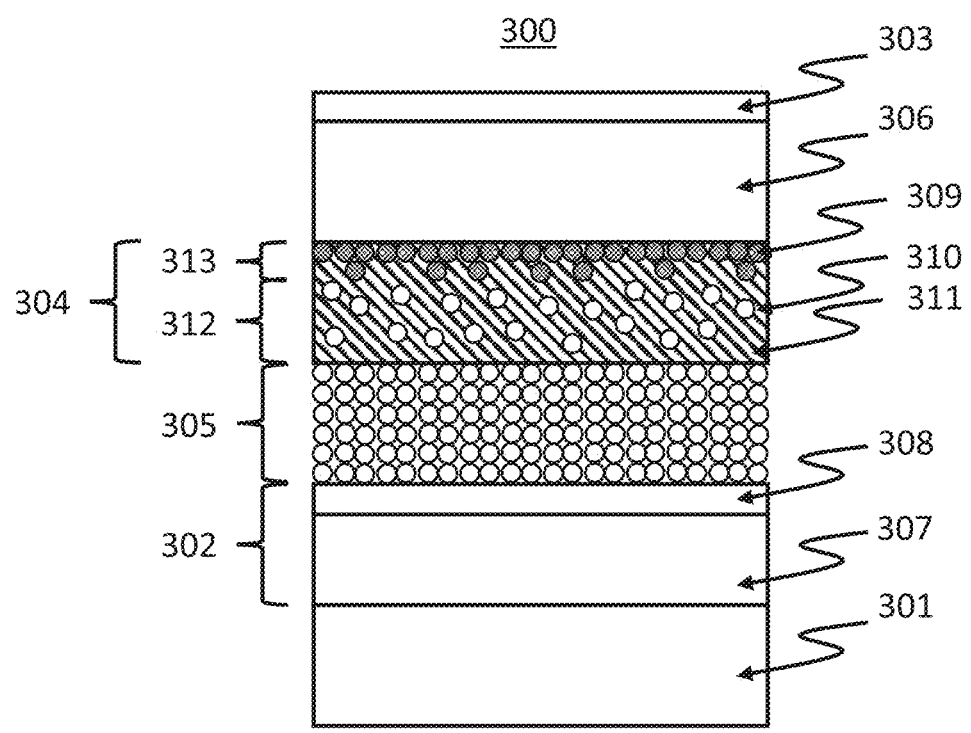
FIG. 3 illustrates a cross-sectional view of a QLED according to an example implementation of the present disclosure, in which the EML includes quantum dots and charge transport nanoparticles in a charge transport organic matrix, and the quantum dots are phase separated from the organic matrix.

FIG. 3 illustrates a cross-sectional view of a QLED 300 according to an example implementation of the present disclosure in which the EML 304 includes quantum dots 309 and charge transport nanoparticles in a charge transport organic matrix 311 and the quantum dots 309 are phase separated from the organic matrix. Certain combinations of quantum dots 309, ligand and organic charge transport material may result in phase separation during deposition of the EML 304. For example, quantum dots with ligands, such as indium phosphide quantum dots with dodecanethiol ligands, are mixed with an organic hole transport material, such as N4,N4'-bis(4-(6-((3-ethyloxetan-3-yl)methoxy)hexyl)phenyl-N4,N4'-diphenylbiphenyl-4-4'-diamine, commonly referred to as OTPD, and n-type charge transport nanoparticles, such as zinc oxide nanoparticles, then deposited. The majority of the quantum dots form a layer at the top surface of the OTPD. As illustrated in FIG. 3, the QLED 300 has an inverted structure fabricated according to any of the previous descriptions and an EML 304 that is a mixture of the quantum dots 309 made of indium phosphide in a charge transport organic matrix 311 including the OTPD, charge transport nanoparticles 310 and a photoinitiator in toluene. The charge transport nanoparticles 310 are n-type (electron transport) metal oxide nanoparticles which are configured to resist phase separation by choice of capping ligand.

The EML 304 includes a lower EML 312 and an upper EML 313. The resulting QLED 300 includes the EML 304 having the charge transport nanoparticles 310 (electron transport) in a charge transport organic matrix (hole transport) 311 at the lower EML 312 adjacent to the first charge transport layer 305 (electron transport). The quantum dots 309 in the charge transport organic matrix 311 are distributed at the upper EML 313 adjacent to the second charge transport layer 306 (hole transport).

Electrons may be transported from the first charge transport layer 305 to the quantum dots 309 via the charge transport nanoparticles 310 in the EML 304, where the electrons can recombine with holes transported from the second charge transport layer 306 to emit light. The QLED 300 is an efficient inverted QLED with low operating voltage which may be patterned by photolithography.

It should be noted that electrodes 302 and 303, the first charge transport layer 305, the second charge transport layer 306, a reflector 307, a transparent electrode (a conductive layer) 308, and the charge transport organic matrix 311 may be substantially similar to electrodes 202 and 203, a first charge transport layer 205, a second charge transport layer 206, a reflector 207, a transparent electrode (a conductive layer) 208, and a charge transport organic matrix 211, respectively, as described with reference to FIG. 2A, thus, the details of which are omitted for brevity.

Figure 4:
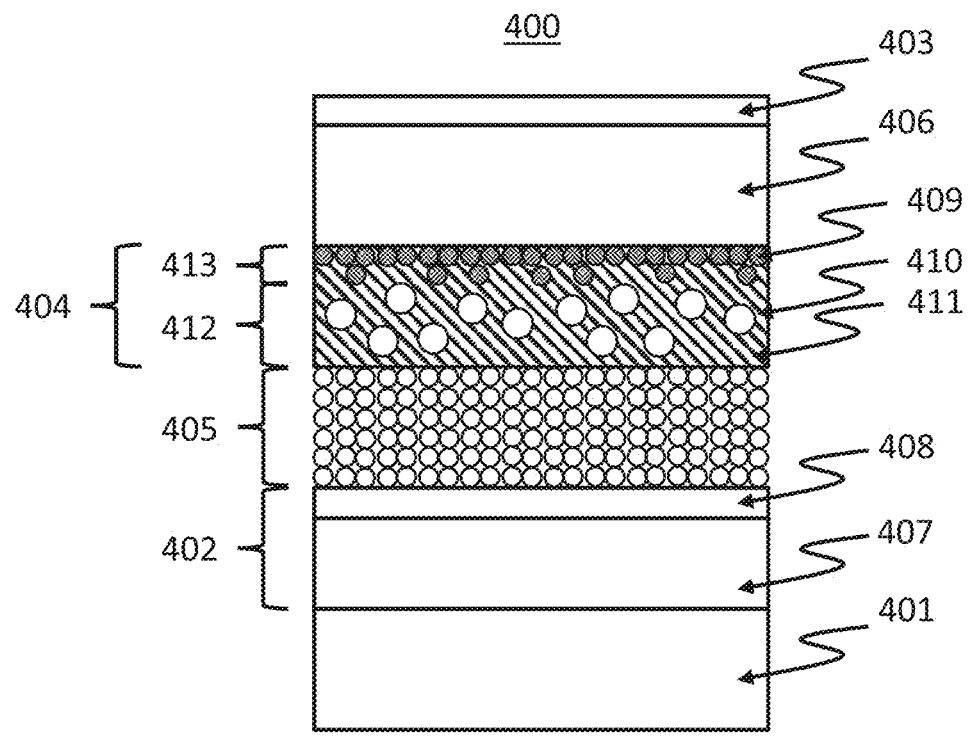
FIG. 4 illustrates a cross-sectional view of a QLED according to an example implementation of the present disclosure, in which the charge transport nanoparticles in a charge transport organic matrix are not phase separated from the organic matrix.

FIG. 4 illustrates a cross-sectional view of a QLED 400 according to an example implementation of the present disclosure in which the charge transport nanoparticles 410 in a charge transport organic matrix 411 are not phase separated from the charge transport organic matrix 411. In the QLED 400 (having an inverted structure), the charge transport nanoparticles 410 in an EML 404 are larger than quantum dots 409. The QLED 400 in FIG. 4 makes the charge transport nanoparticles 410 less likely to phase separate because an increased average cross-sectional area of the charge transport nanoparticles 410 provides more resistance to movement within the EML 404 solution during deposition. The QLED 400 in FIG. 4 allows ligands (not shown) on surfaces of the charge transport nanoparticles 410 to be selected based on charge transport and solubility properties of the charge transport nanoparticles 410.

In the inverted QLED 400 of FIG. 4, the EML 404 is a mixture of the quantum dots 409 in a charge transport organic matrix 411, the charge transport nanoparticles 410 and a photoinitiator in toluene. The charge transport nanoparticles 410 are n-type (electron transport) nanoparticles.

The EML 404 includes a lower EML 412 and an upper EML 413. The resulting QLED 400 includes the EML 404 having the charge transport nanoparticles 410 (electron transport) in a charge transport organic matrix (hole transport) 411 at the lower EML 412 adjacent to the first charge transport layer 405 (electron transport). The quantum dots 409 in the charge transport organic matrix 411 are distributed at the upper EML 413 adjacent to the second charge transport layer 406 (hole transport).

It should be noted that electrodes 402 and 403, the first charge transport layer 405, the second charge transport layer 406, a reflector 407, a transparent electrode 408, and the charge transport organic matrix 411 may be substantially similar to electrodes 202 and 203, a first charge transport layer 205, a second charge transport layer 206, a reflector 207, a transparent electrode (a conductive layer) 208, and a charge transport organic matrix 211, respectively, as described with reference to FIG. 2A, thus, the details of which are omitted for brevity.

Figure 5:
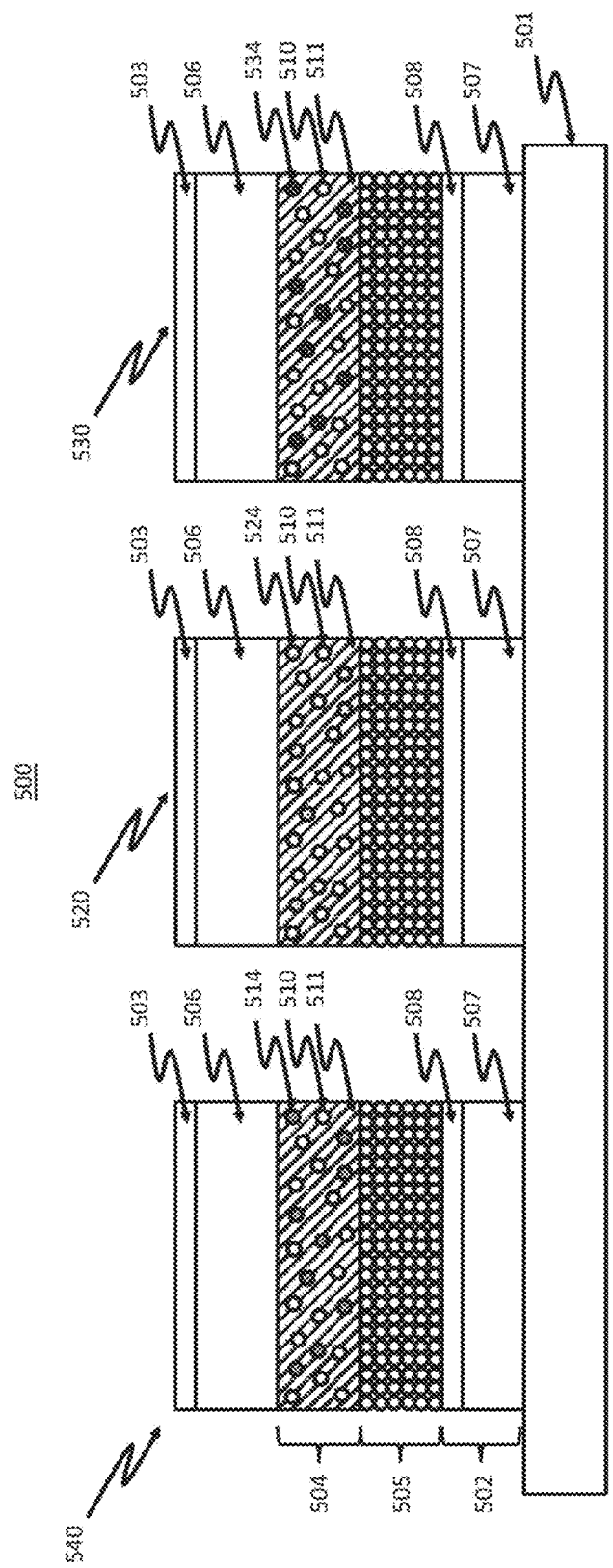
FIG. 5 illustrates a cross-sectional view of a display device including a plurality of QLEDs according to an example implementation of the present disclosure.

FIG. 5 illustrates a cross-sectional view of a display device 500 including a plurality of QLEDs 520, 530, 540 according to an example implementation of the present disclosure. The display device 500 utilizes QLEDs with patterned EMLs 504 which are configured according to the present disclosure. Each adjacent sub-pixel is configured to emit either red, green or blue light. This is achieved by a patterning process, such as photolithography. The QLEDs 520, 530, 540 are fabricated according to any of the processes previously described.

In QLED 540, charge transport nanoparticles 510, a charge transport organic matrix 511, a photoinitiator and red quantum dots 514 emitting red light are mixed and deposited over an entirety of a substrate 501. An EML 504 in a red sub-pixel QLED 540 is then exposed to UV illumination while the EMLs 504 in a green sub-pixel 520 and a blue sub-pixel 530 are not, such as via a photolithography mask, thereby selectively polymerizing and forming the organic matrix in the red sub-pixel 540 only.

It should be noted that electrodes 502 and 503, a first charge transport layer 505, a second charge transport layer 506, a reflector 507, a transparent electrode 508, and a charge transport organic matrix 511 may be substantially similar to electrodes 202 and 203, a first charge transport layer 205, a second charge transport layer 206, a reflector 207, a transparent electrode (a conductive layer) 208, and a charge transport organic matrix 211, respectively, as described with reference to FIG. 2A, thus, the details of which are omitted for brevity.

FIGS. 6A, 6B, 6C, 6D-i, 6D-ii, and 6E illustrate fabrication processes of a light-emitting device according to example implementations of the present disclosure. FIGS. 6A, 6B, 6C, 6D-i, 6D-ii, and 6E illustrate principally a QLED device having an inverted structure wherein the first electrode 602 is a cathode and the second electrode (not shown) is an anode. Comparable principles may be applicable to QLED devices with a standard structure. In this fabrication method, a phase separated crosslinked emissive layer (or at least a portion thereof) is produced. In this implementation, the emissive layer may be patterned by UV-exposing the desired area of the deposited emissive layer. The patterned emissive layer may then be insoluble in the UV-exposed area and the remaining materials may be removed, such as by being washed away with a solvent.

As shown in FIG. 6A, at an initial step a substrate or comparable base layer 601 is provided. As shown in FIG. 6B, a first electrode 602 is deposited on the substrate 601, and the base layer further may include a first electrode 602. Additional charge transport layers may be deposited on the first electrode 602 and other base layers as described above with respect to other implementations. The base layer 601, therefore, further may include an electron transport layer (e.g. nanoparticles) or electron transport layer having a cross-linkable electron transport material, and an activation stimulus crosslinks the electron transport layer with the emissive layer to form a first portion of a combined charge transport and emissive layer (CCTEL) 620 (FIG. 6E). The electrode 602 (or other base layer component) may be deposited on the substrate 601 using any suitable method known in the art. Example deposition methods include sputtering, evaporative coating, printing, chemical vapor deposition, and the like. As described above, the deposited electrode may be provided in any suitable form, and one exemplary implementation is an electrode for a TFT circuit.

In FIG. 6C, a mixture 603 including a cross-linkable material 605, quantum dots 606, and electron transport nanoparticles 610 and a solvent 604 is deposited on the first electrode 602 and the substrate 601. In some implementations, the mixture 603 additionally includes photo initiator, as described above. Between steps depicted in FIG. 6C and FIG. 6D-i/6D-ii, some of the solvent may evaporate.

As shown in FIGS. 6D-i and 6D-ii, ultraviolet (UV) light 608 then is applied through a mask 607 that provides a shape or pattern through which the desired area of the mixture 603 is exposed to the UV light 608. Exposure of the mixture 603 to the UV light results in the crosslinking of the cross-linkable material 605. In implementations in which the mixture 603 also includes a photo initiator, the photo initiator may assist in initializing the cross-linking of the cross-linkable material 605. As shown in FIG. 6E, the result of the above-described processes is a phase separated CCTEL 620, whereby the crosslinking of the cross-linkable material 605 results in phase separation of the QDs 606 in the outer upper portion of the CCTEL 620, or separation of the QDs 606 and electron transport nanoparticles 610 randomly dispersed within the hole transport organic matrix. In one variation of the processes through FIGS. 6D-i to 6E, the QDs 606 remain distributed within the cross-linkable material 605 during the deposition process, with the UV exposure causing the gravamen of the phase separation. In one variation of the processes through FIG. 6D-ii to 6E, the QDs 606 phase separate during the deposition process as the solvent evaporates. The variations may occur to some degree in combination. In all such variations, the UV exposure polymerizes the cross-linkable material 605 and solidifies the phase separation that is depicted in the resultant FIG. 6E.

Accordingly, in the phase separated CCTEL 620, the QDs 606 become positioned within the CCTEL 620 adjacent to or at an outer surface layer, e.g., the top surface layer, to form a quantum dot layer 609. The QDs 606 are immobilized within the quantum dot layer 609 and prevented from traveling throughout the formed crosslinked matrix 611 that is composed of the remainder of the cross-linkable material 605. The phase separated CCTEL 620, therefore, is composed of a first quantum dot layer 609 portion mainly composed of QDs, which may be a monolayer of QDs having emissive properties constituting an emissive portion of the CCTEL 620, and a second crosslinked matrix 611 portion mainly composed of the cross-linked material having charge transport and/or injecting and/or blocking properties. Accordingly, the first portion also is referred to as the emissive portion of the CCTEL 620, and the second portion may be referred to as the charge manipulation portion of the CCTEL 620.

As further shown in FIG. 6E, the remaining mixture 603 (FIG. 6C) that had been masked by the mask 607 of FIG. 6D-i/6D-ii (and thus not exposed to the UV light 608) may be washed away with a solvent, and the CCTEL combination 620 of the emissive portion and the charge manipulation (charge transport and/or injecting and/or blocking) portion remains following the UV light 608 exposure, as the CCTEL 620 is insoluble in the solvent. In some implementations, the solvent is the same solvent used in the mixture 603 that is deposited in FIG. 6C. In other implementations, the solvent is a similar solvent or orthogonal solvent to the solvent used in the mixture 603 that is deposited in FIG. 6C. Accordingly, as shown in FIG. 6E, the combination of emissive portion and charge manipulation portion remains on the first electrode 602. The solvent used in the mixture 603 and/or the solvent used to wash away the remaining mixture may be evaporated during annealing (e.g., heating) of the deposited layer. The annealing may be performed at any suitable temperature that effectuates evaporation of the solvent while also maintaining the integrity of the quantum dots and charge transport material. In exemplary implementations, annealing may be performed at a temperature ranging from 5° C. to 150° C., or at a temperature ranging from 30° C. to 150° C., or at a temperature ranging from 30° C. to 100° C.

In an exemplary implementation, subsequent to the application of UV light 608 as shown in FIGS. 6D-i and 6D-ii, the mixture 603 layer may be annealed (e.g., heated) to facilitate evaporation and removal of the solvent(s). This annealing may be performed prior to the washing or subsequent to the washing. In implementations in which the annealing is performed prior to the washing, a subsequent annealing may be performed after washing. As another example, application of UV light 608 as shown in FIGS. 6D-i and 6D-ii and annealing may be performed in parallel. This may remove the solvent used in the mixture 603. Subsequent to the washing, a subsequent annealing may be performed. In yet another example, annealing may be conducted prior to application of UV light 608 as shown in FIGS. 6D-i and 6D-ii, and subsequent to the washing, a subsequent annealing may be performed.

Factors such as the UV light 608 exposure times, UV-intensity, amount of photo initiator, a ratio between QDs 606 and cross-linkable material 605, and total concentration of the mixture 603 may allow for control of the morphology of the emissive material. For example, UV light 608 exposure time may range from 0.001 seconds to 15 minutes, and/or UV light 608 exposure intensity may range from 0.001 to 100,000 mJ/cm$^2$. The amount of photo initiator may range from 0.001 to 15 wt % of the total concentration of the mixture. The ratio between QDs 606 and cross-linkable material 605 may range from 0.001 to 1, and the total concentration of the mixture 603 may range from 0.1 to 20 wt %. In an exemplary implementation, the UV light 608 exposure intensity ranges from 1 to 100 mJ/cm$^2$ at a UV light 608 exposure time of 0.01 to 200 seconds, the total concentration of the mixture 603 ranges from 0.5 and 10 wt %, the ratio between QDs 606 and cross-linkable material 605 ranges from 0.1 and 1, and the photo initiator concentration ranges from 0.1 and 5 wt % of the total concentration of the mixture 603.

Using an approach such as that previously disclosed, different sub-pixels (e.g., R, G and B) can be patterned on a given substrate 601 in a manner that delineates the areas in which the materials that constitute the QLED sub-pixel structures are deposited. Furthermore, in other exemplary implementations, one or more activation stimuli in addition to or other than UV light 608 can be used. Examples include pressure, heat, a second exposure of light (this can be in the UV range or other ranges such as Visible or IR), and change in pH. Accordingly, in some implementations, the method of producing the crosslinked emissive layer illustrated in FIGS. 6A-6E may be modified, for example, with respect to the phase separation step shown in FIGS. 6D-i/6D-ii. For example, instead of the application of UV light 608 as the activation stimulus, the crosslinking step may include instead or additionally one or more activation stimuli including the application of pressure, increase in temperature, and/or an addition to the mixture 603 to provide a change in pH. Application of any activation stimulus or combination thereof may provide for formation of the phase separated matrix that constitutes the CCTEL 620.

With reference to the implementation illustrated in FIG. 5, a solvent washing step is then applied which removes the unpolymerized EML 504 from the green sub-pixel 520 and the blue sub-pixel 530 while the EML in the red sub-pixel 540 remains. By using two further EML 504 depositions and washing steps, in which green quantum dots 524 emitting green light or blue quantum dots 534 emitting blue light are used in place of the red quantum dots 514, red, green and blue EMLs 504 may be selectively fabricated in each of the red sub-pixel 540, a green sub-pixel 520, and a blue sub-pixel 530. The remaining layers are then deposited as previously described. Non-EML layers may also be patterned such that different materials or layer thicknesses may be used in different sub-pixels, or they may be common to all sub-pixels.

With reference to the implementation illustrated in FIG. 5, the mixed EML 504 is a negative photoresist, where the EML 504 is exposed to UV illumination remains after the washing step and the unexposed EML 504 washes away. However, it should be understood that a positive photoresist-type EML 504 could also be used. The organic charge transport material may be polymerized when thermally treated and then break down when exposed to UV illumination, thereby resulting in exposed areas being removed during the washing step while unexposed areas remain.

Suitable materials and deposition methods according to the present disclosure for each of the layers previously described are as follows:

Transparent electrode (the conductive layer 208): 100 nm of ITO, IZO, IGZO or FTO by sputtering or solution processing of nanoparticles.

Reflective electrode (the reflector 207): >30 nm of Al or Ag by sputtering, thermal evaporation or solution processing of nanowires.

Top electrode for top emitters (the second electrode 203): <25 nm of Ag, Mgx:Ag where 0.05<x<20, bilayer <3 nm Al and <25 nm by sputtering or thermal evaporation.

Electron injection layer materials: <2 nm LiF, <2 nm CsCO$_3$, <30 nm Ca.

Hole injection layer (the hole injection layer 257) materials: poly(3,4-ethylenedioxythiophene):poly(styrene-sulfonate) (PEDOT:PSS), 1,4,5,8,9,11-hexaazatriphenylenehexacarbonitrile (HATCN), copper thiocyanate (CuSCN).

Hole transport nanoparticles (the charge transport nanoparticles 210): MoO$_3$, WO$_3$, CuO, Mg$_{1-x}$Ni$_x$O where 0≤x≤1, V$_2$O$_5$.

Hole transport organic materials (the charge transport organic matrix 211): poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenyl-benzidine) (PolyTPD), 4,4'-bis(N-carbazolyl)-1,1'-biphenyl (CBP), 2,3,5,6-tetrafluoro-7,7,8,8-tetracyanoquinodimethane (F4TCNQ), poly(4-butylphenyldiphenylamine) (poly-TPD), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), 3,5-di-9H-carbazol-9-yl-N,N-bis[4-[[6-[(3-ethyl-3-oxetanyl)methoxy]hexyl]oxy]phenyl]-benzenamine (Oxe-DCDPA).

Electron transport nanoparticles (the charge transport nanoparticles 210): ZnO, Mg$_{1-x}$Zn$_x$O, Al$_{1-x}$Zn$_x$O, Ga$_{1-x}$Zn$_x$O, Li$_{1-x}$Zn$_x$O, ZrO$_2$, TiO$_2$, where 0≤x<1.

Electron transport organic materials (the charge transport organic matrix 211): 2,2',2"-(1,3,5-benzenetriyl)-tris(1-phenyl-1-H-benzimidazole) (TPBi), N4,N4'-Di(naphthalen-1-yl)-N4,N4'-bis(4-vinylphenyl)biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD).

Quantum dots (the quantum dots 209): compounds containing one or more of: InP, CdSe, CdS, $CdSeS_{1-x}$, CdTe, $Cd_xZn_{1-x}Se$, $Cd_xZn_{1-x}Se_yS_{1-y}$, ZnSe, $ZnTe_xSe_{1-x}$, ZnTe, perovskites of the form $ABX_3$ where X is any halide, $Zn_wCu_zIn_{1-(w+z)}S$ where $0 \leq w, x, y, z \leq 1$ and $(w+z) \leq 1$, carbon.

In some implementations the cross-linked hole transport layer is formed using one or more photo-initiators. As such, the cross-linked hole transport layer may include one or more photo-initiators. A photo initiator is a material that initiates polymerization in response to light stimuli. In some implementations, the photo initiator may generate one or more radicals, ions, acids, and/or species that may initiate such polymerization.

Example photo initiators include sulfonium- and iodonium-salts (e.g. triphenylsulfonium triflate, diphenyliodonium triflate, iodonium, [4-(octyloxy)phenyl]phenyl hexafluorophosphate (OPPI), bis(4-methylphenyl)iodonium hexafluorophosphate, diphenyliodonium hexafluoroarsenate, diphenyliodonium hexafluoroantimonate, etc), chromophores containing the benzoyl group (benzoin ether derivatives, halogenated ketones, dialkoxyacetophenones, diphenylacetophenones, etc), hydroxy alkyl heterocyclic or conjugated ketones, benzophenone- and thioxanthone-moiety-based cleavable systems (such as benzophenone phenyl sulfides, ketosulfoxides, etc), benzoyl phosphine oxide derivatives, phosphine oxide derivatives, trichloromethyl triazines, biradical-generating ketones, peroxides, diketones, azides and aromatic bis-azides, azo derivatives, disulfide derivatives, disilane derivatives, diselenide and diphenylditelluride derivatives, digermane and distannane derivatives, peresters, barton's ester derivatives, hydroxamic and thiohydroxamic acids and esters, organoborates, titanocenes, chromium complexes, aluminate complexes, tempo-based alkoxyamines, oxyamines, alkoxyamines, and silyloxyamines.

In some implementations, when the specific area of the deposited layer is exposed to UV light, the photo initiator initiates the polymerization of the cross-linkable material. QDs, ligands of the QDs, cross-linkable material, charge transport material, and photo initiator can be selected to create uniform dispersion in the deposition solvent. Materials with similar polarity indexes can be selected to ensure homogeneity of the deposited mixtures.

From the previous description, it is clear that various techniques may be used for implementing the concepts described in the present disclosure without departing from the scope of those concepts. Moreover, while the concepts have been described with specific reference to certain implementations, a person of ordinary skill in the art may recognize that changes may be made in form and detail without departing from the scope of those concepts.

As such, the present disclosure is to be considered in all respects as illustrative and not restrictive. It should also be understood that the present disclosure is not limited such that many rearrangements, modifications, and substitutions are possible without departing from the scope of the present disclosure.

What is claimed is:

1. A light emitting device comprising:
a first electrode;
a second electrode; and
an emissive layer (EML) between the first electrode and the second electrode and electrically connected to the first electrode and the second electrode, the EML comprising:
a charge transport matrix of a first polarity;
a plurality of quantum dots in the charge transport matrix; and
a plurality of charge transport nanoparticles of a second polarity dispersed in the charge transport matrix, wherein
the EML is phase-separated into a lower emitting layer closer to the first electrode than the second electrode and an upper emitting layer closer to the second electrode than the first electrode, and
the lower emitting layer comprises higher in quantity of the plurality of charge transport nanoparticles than the quantity of charge transport nanoparticles in the upper emitting layer, and the upper emitting layer comprises higher in quantity of the plurality of quantum dots than the quantity of quantum dots in the lower emitting layer.

2. The light emitting device of claim 1, wherein the plurality of charge transport nanoparticles conducts charge carriers opposite to charge carriers conducted by the charge transport matrix.

3. The light emitting device of claim 1, further comprising an electron transport layer (ETL) between the EML and the first electrode, wherein the first electrode is a cathode.

4. The light emitting device of claim 3, wherein the ETL comprises metal oxide nanoparticles.

5. The light emitting device of claim 4, wherein the plurality of charge transport nanoparticles in the EML and the metal oxide nanoparticles in the ETL are identical in composition.

6. The light emitting device of claim 1, further comprising a hole transport layer (HTL) between the EML and the first electrode, wherein the first electrode is an anode.

7. The light emitting device of claim 6, wherein the HTL comprises hole transport organic molecules.

8. The light emitting device of claim 7, wherein the hole transport organic molecules are arranged in a matrix comprising long chain polymers.

9. The light emitting device of claim 7, wherein the charge transport matrix in the EML includes organic molecules identical in composition as the hole transport organic molecules in the HTL.

10. The light emitting device of claim 1, wherein:
the first electrode is a cathode disposed between a substrate and the EML; and
the second electrode is an anode.

11. The light emitting device of claim 1, wherein:
the first electrode is an anode disposed between a substrate and the EML; and
the second electrode is a cathode.

12. The light emitting device of claim 1, wherein:
the first electrode is disposed between a substrate and the EML;
the first electrode reflects light; and
the second electrode transmits light.

13. The light emitting device of claim 1, wherein:

the first electrode is disposed between a substrate and the EML;

the first electrode transmits light; and the second electrode reflects light.

14. A display device comprising:

a substrate; and a plurality of the light emitting devices of claim 1 on the substrate;

wherein each of the light emitting devices emits one of:

a red light with a wavelength between 600 nm and 700 nm, a green light with a wavelength between 500 nm and 600 nm, and a blue light with a wavelength between 400 nm and 500 nm.

15. The light emitting device of claim 1, wherein an average separation distance between two adjacent ones of the plurality of charge transport nanoparticles is less than an average diameter of the plurality of charge transport nanoparticles.

16. The light emitting device of claim 1, wherein an average diameter of the plurality of charge transport nanoparticles is greater than an average diameter of the plurality of quantum dots.

17. An emissive layer (EML) of a light emitting device, the EML comprising:

a charge transport matrix of a first polarity;

a plurality of quantum dots in the charge transport matrix; and a plurality of charge transport nanoparticles of a second polarity dispersed in the charge transport matrix, wherein the EML is phase-separated into a lower emitting layer and an upper emitting layer that is a layer above the lower emitting layer, and the lower emitting layer comprises higher in quantity of the plurality of charge transport nanoparticles than the quantity of charge transport nanoparticles in the upper emitting layer, and the upper emitting layer comprises higher in quantity of the plurality of quantum dots than the quantity of quantum dots in the lower emitting layer.

18. The EML of claim 17, wherein the plurality of charge transport nanoparticles conducts charge carriers opposite to charge carriers conducted by the charge transport matrix.

19. The EML of claim 17, wherein an average separation distance between two adjacent charge transport nanoparticles of the plurality of charge transport nanoparticles is less than an average diameter of the plurality of charge transport nanoparticles.

20. The EML of claim 17, wherein an average diameter of the plurality of charge transport nanoparticles is greater than an average diameter of the plurality of quantum dots.

* * * * *